(12) United States Patent
Noguchi et al.

(10) Patent No.: US 12,183,551 B2
(45) Date of Patent: Dec. 31, 2024

(54) GAS NOZZLE, MANUFACTURING METHOD OF GAS NOZZLE, AND PLASMA TREATMENT DEVICE

(71) Applicant: KYOCERA Corporation, Kyoto (JP)

(72) Inventors: Yukio Noguchi, Koka (JP); Tomoya Sahashi, Omihachiman (JP)

(73) Assignee: KYOCERA CORPORATION, Kyoto (JP)

( * ) Notice: Subject to any disclaimer, the term of this patent is extended or adjusted under 35 U.S.C. 154(b) by 812 days.

(21) Appl. No.: 17/296,052

(22) PCT Filed: Nov. 22, 2019

(86) PCT No.: PCT/JP2019/045873
§ 371 (c)(1),
(2) Date: May 21, 2021

(87) PCT Pub. No.: WO2020/110964
PCT Pub. Date: Jun. 4, 2020

(65) Prior Publication Data
US 2022/0020563 A1  Jan. 20, 2022

(30) Foreign Application Priority Data
Nov. 26, 2018  (JP) ................................. 2018-220559

(51) Int. Cl.
*B24C 1/04* (2006.01)
*B24C 1/08* (2006.01)
*C04B 35/505* (2006.01)
*C04B 35/64* (2006.01)
*C23C 16/455* (2006.01)
*H01J 37/32* (2006.01)

(52) U.S. Cl.
CPC ............ *H01J 37/3244* (2013.01); *B24C 1/04* (2013.01); *B24C 1/08* (2013.01); *C04B 35/505* (2013.01); *C04B 35/64* (2013.01); *C23C 16/45578* (2013.01); *C04B 2235/3217* (2013.01); *H01J 2237/3321* (2013.01); *H01J 2237/334* (2013.01)

(58) Field of Classification Search
None
See application file for complete search history.

(56) References Cited

U.S. PATENT DOCUMENTS 9,790,596 B1   10/2017  Kajiwara
2014/0283995 A1  9/2014  Tanaka
(Continued)

FOREIGN PATENT DOCUMENTS

JP   H2-19468 U    2/1990
JP   2005-286069 A  10/2005
(Continued)

*Primary Examiner* — Levon J Shahinian
(74) *Attorney, Agent, or Firm* — Procopio, Cory, Hargreaves & Savitch LLP

(57) ABSTRACT

A gas nozzle according to the present disclosure includes a supply hole having a tubular shape and configured to guide a gas and an injection hole connecting to the supply hole. The gas nozzle configured to inject the gas from the injection hole is made from ceramics or single crystal including an oxide, a fluoride, or an oxyfluoride of a rare earth element or an yttrium aluminum composite oxide as a primary component. An arithmetic mean roughness Ra of an inner circumferential surface forming the supply hole is smaller on an outflow side than on an inflow side of the gas.

8 Claims, 3 Drawing Sheets

(56) References Cited

U.S. PATENT DOCUMENTS

| | | |
|---|---|---|
| 2016/0047040 A1 | 2/2016 | Mishra |
| 2017/0133204 A1 | 5/2017 | Moyama et al. |
| 2018/0312974 A1 | 11/2018 | Noguchi et al. |

FOREIGN PATENT DOCUMENTS

| | | |
|---|---|---|
| JP | 2006196491 A | 7/2006 |
| JP | 2007-63595 A | 3/2007 |
| JP | 2008-222979 A | 9/2008 |
| JP | 2012054266 A | 3/2012 |
| JP | 2013-49096 A | 3/2013 |
| JP | 2017-91779 A | 5/2017 |
| WO | 2013/065666 A1 | 5/2013 |
| WO | 2014/119177 A1 | 8/2014 |
| WO | 2017/073679 A1 | 5/2017 |

GAS NOZZLE, MANUFACTURING METHOD OF GAS NOZZLE, AND PLASMA TREATMENT DEVICE

TECHNICAL FIELD

The present disclosure relates to a gas nozzle and a plasma treatment device.

BACKGROUND ART

In the related art, plasma is utilized to process an object to be processed in steps such as etching and film formation in manufacturing a semiconductor or a liquid crystal. A highly reactive fluorine-based or chlorine-based corrosive gas containing halogen elements is employed in such steps. Therefore, high corrosion resistance is required for members that are used for a semiconductor or liquid crystal manufacturing apparatus and come into contact with such a corrosive gas or its plasma. In an example of such a member, Patent Document 1 proposes a gas nozzle formed by a $Y_2O_3$ sintered body. The inner surface of the gas nozzle where the corrosive gas flows is in an as-fired state, and the outer surface of the gas nozzle exposed to the corrosive gas or its plasma is roughened. Patent Document 1 states that blasting processing is employed in roughening the outer surface.

Patent Document 2 describes a gas nozzle containing yttria as a primary component and formed with a through hole formed by grinding processing after a compact is formed by a CIP molding method and fired in an air atmosphere at not less than 1400° C. and not greater than 1700° C. Furthermore, FIG. 2 of Patent Document 2 illustrates the through hole including a tubular supply hole and an injection hole connecting to the supply hole and having a diameter less than that of the supply hole.

CITATION LIST

Patent Literature

Patent Document 1: JP 2007-63595 A
Patent Document 2: WO 2013/065666

SUMMARY

Technical Problem

As described in Patent Document 1, in the gas nozzle including the outer surface roughened by blasting processing using abrasive particles, the abrasive particles entering a through hole of the gas nozzle easily adhere to an inner surface of the gas nozzle. Therefore, when a corrosive gas passes through the through hole, there is a problem in that the abrasive particles are then converted into a particulate state and float in the plasma space.

In the gas nozzle described in Patent Document 2, the gas flow resistance increases in the vicinity where the gas flows from the supply hole into the injection hole. Therefore, with increasing flow resistance, particles may be generated from an inner circumferential surface forming the supply hole and float in the plasma space. Furthermore, the elongated supply hole causes a problem in that it is difficult to form the supply hole by grinding processing.

Meanwhile, in recent years, semiconductors are increasingly integrated, a semiconductor having the fine internal structure is manufactured, and thus, the width of a memory wiring line is narrowed to a width of not greater than 10 nm. When the width of the memory wiring line is not greater than 10 nm, fine particles having a diameter of not greater than 0.2 µm, which have not been seen as a problem, damage the memory wiring line and semiconductor elements. In view of this problem, it is necessary to reduce generation of particles even finer than the particles generated from the gas nozzles proposed in Patent Documents 1 and 2.

An object of the present disclosure is to provide a gas nozzle and a plasma treatment device that can reduce generation of fine particles, in particular, generation of fine particles in the vicinity where gas flows from a supply hole into an injection hole.

Solution to Problem

A gas nozzle according to the present disclosure includes a supply hole having a tubular shape and configured to guide a gas and an injection hole connecting to the supply hole. The gas nozzle configured to inject the gas from the injection hole is made from ceramics or single crystal including an oxide, a fluoride, or an oxyfluoride of a rare earth element or an yttrium aluminum composite oxide as a primary component, and an arithmetic mean roughness Ra of an inner circumferential surface forming the supply hole is smaller on an outflow side than on an inflow side of the gas.

A manufacturing method of a gas nozzle according to the present disclosure includes pressing and molding granules including an oxide, a fluoride, or an oxyfluoride of a rare earth element or an yttrium aluminum composite oxide as a primary component to obtain a compact, machining the compact to obtain a precursor formed with a pilot hole for a supply hole and a pilot hole for an injection hole, firing the precursor to obtain a sintered body, and polishing at least an inner circumferential surface of the sintered body forming the supply hole by an abrasive flow polishing method.

A manufacturing method of a gas nozzle according to the present disclosure includes pressing and molding granules including an oxide, a fluoride, or an oxyfluoride of a rare earth element or an yttrium aluminum composite oxide as a primary component to obtain a compact, forming a pilot hole for a supply hole and a pilot hole for an injection hole in the compact by using a first cutting tool including a first shank provided with a spiral groove, and subsequently machining at least an inner circumferential surface forming a pilot hole for a supply hole using a second cutting tool including a second shank mounted with a disc-shaped tip on an end side of the second shank to obtain a precursor, the disc-shaped tip having a diameter greater than a diameter of the second shank, and firing the precursor to obtain a sintered body.

A manufacturing method of a gas nozzle according to the present disclosure includes growing a single crystal ingot having a columnar shape and including an oxide, a fluoride, or an oxyfluoride of a rare earth element or an yttrium aluminum composite oxide as a primary component, performing honing processing, rotary ultrasonic processing, or grinding processing on the single crystal ingot to form the supply hole and the injection hole, and polishing at least an inner circumferential surface of the single crystal ingot forming the supply hole by using an abrasive flow polishing method.

A plasma treatment device according to the present disclosure includes the gas nozzle described above.

Advantageous Effects of Invention

A gas nozzle in the present disclosure can reduce generation of fine particles.

BRIEF DESCRIPTION OF DRAWINGS

FIG. 2 illustrates the gas nozzle according to an embodiment, employed in the plasma treatment device illustrated in FIG. 1.

FIG. 3 illustrates a gas nozzle according to another embodiment, employed in the plasma treatment device illustrated in FIG. 1.

DESCRIPTION OF EMBODIMENTS

Figure 1:
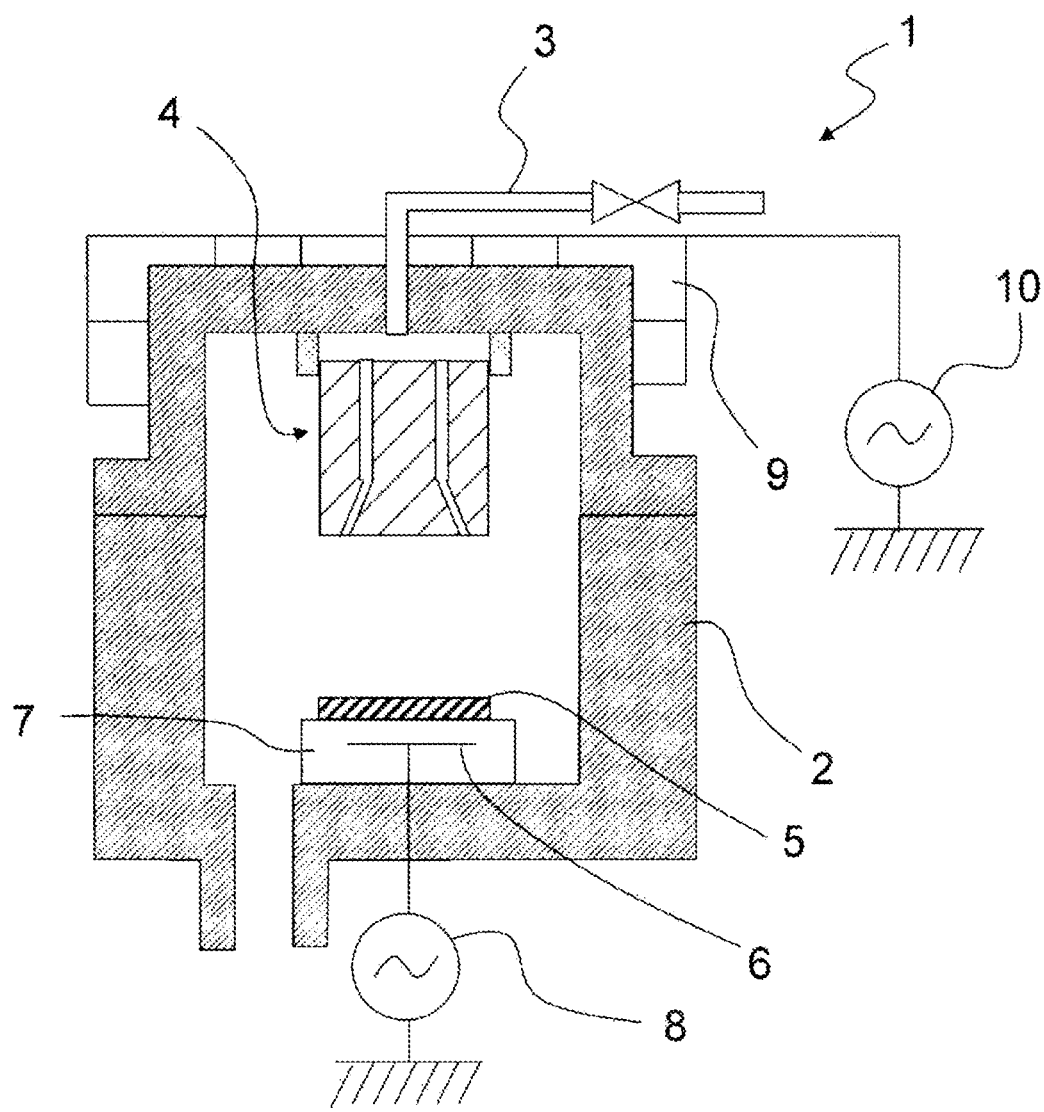
FIG. 1 is a cross-sectional view illustrating an example of a plasma treatment device employing a gas nozzle according to an embodiment of the present disclosure.

A gas nozzle and a plasma treatment device according to the present disclosure will be described in detail below with reference to the drawings. FIG. 1 is a cross-sectional view illustrating an example of a plasma treatment device employing a gas nozzle according to an embodiment of the present disclosure.

For example, a plasma treatment device 1 illustrated in FIG. 1 is a device for forming a thin film on a substrate 5 such as a semiconductor wafer and a glass substrate by a plasma CVD method, and for etching the thin film. The plasma treatment device 1 includes a reaction chamber 2 used for forming a thin film, a gas lead-in pipe 3 through which a gas such as a plasma generation gas or an etching gas is fed into the reaction chamber 2, a gas nozzle 4 connecting to the gas lead-in pipe 3 inside the reaction chamber 2, a substrate holding portion 7, such as an electrostatic chuck, which includes an internal electrode 6 and on which the substrate 5 is placed, a bias power supply 8 electrically connected to the internal electrode 6, a coil 9 used for generating plasma inside the reaction chamber 2, and a power supply 10. The bias power supply 8, the coil 9, and the power supply 10 are each provided outside the reaction chamber 2. The bias power supply 8 is a power supply that supplies high-frequency electric power to the internal electrode 6. The coil 9 and the power supply 10 are an electric discharge means for discharging electric power to a gas supplied to the reaction chamber 2.

Above the substrate 5 in such plasma treatment device 1, a gas fed from the gas nozzle 4 is transited to a plasma state by the coil 9 and the power supply 10. For example, a thin film is formed on the substrate 5, and the thin film is etched by the gas in a plasma state. For example, when a thin film made from silicon dioxide ($SiO_2$) is formed on the substrate 5, plasma generation gases such as a silane ($SiH_4$) gas, an argon (Ar) gas, and an oxygen ($O_2$) gas are supplied. When the thin film is etched, an etching gas such as a fluorine-based gas such as $SF_6$, $CF_4$, $CHF_3$, $ClF_3$, $NF_3$, $C_3F_8$, $C_4F_8$, or HF, or a chlorine-based gas such as $Cl_2$, HCl, $BCl_3$, or $CCl_4$ is supplied.

Figure 2A:
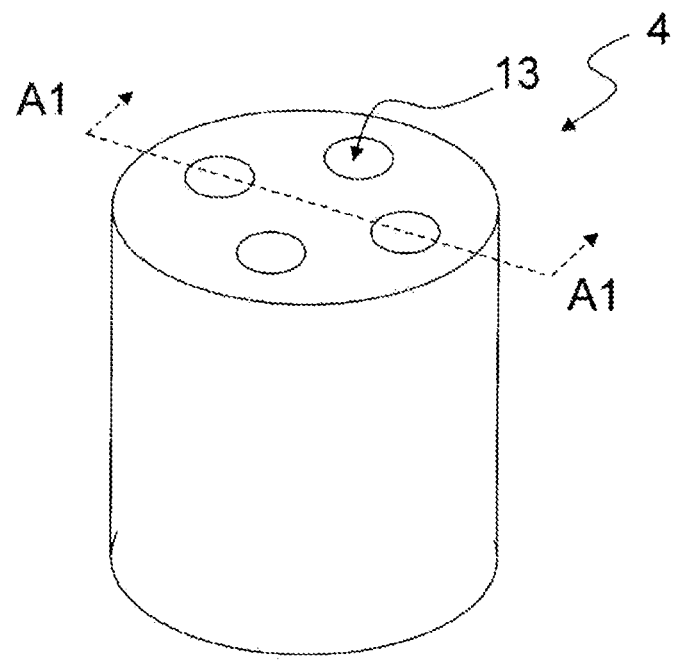
FIG. 2(a) is a perspective view.
Figure 2B:
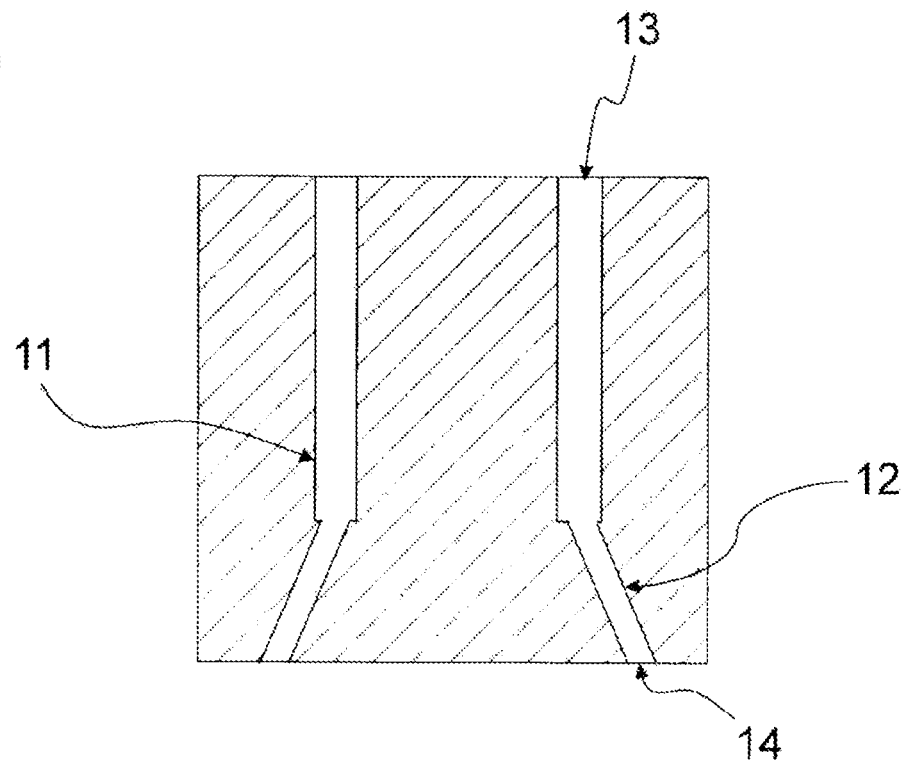
FIG. 2(b) is a cross-sectional view taken along line A1-A1 in FIG. 2(a).
Figure 3A:
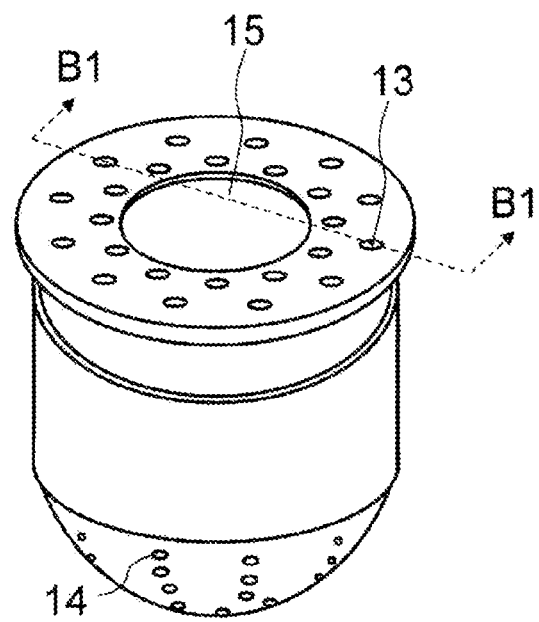
FIG. 3(a) is a perspective view.
Figure 3B:
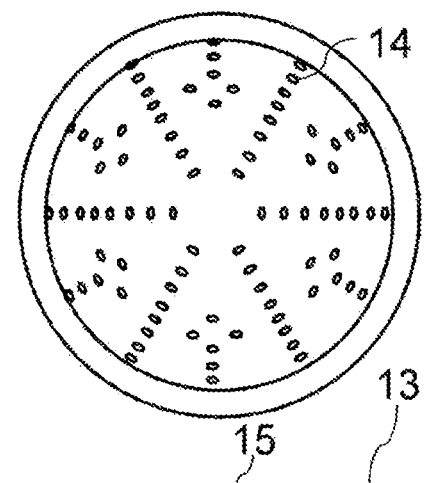
FIG. 3(b) is a bottom view of FIG. 3(a)
Figure 3C:
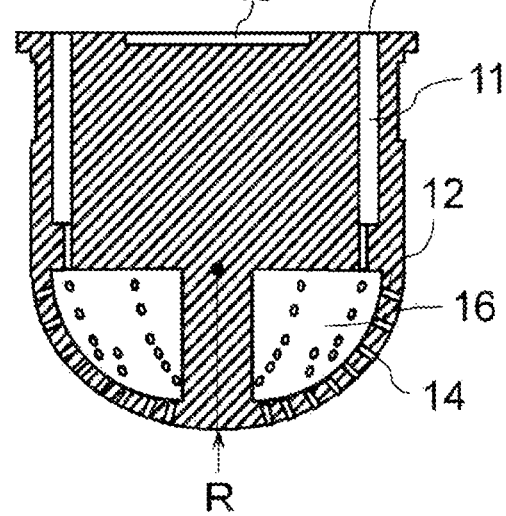
FIG. 3(c) is a cross-sectional view taken along line B1-B1.

FIG. 2 illustrates an example of the gas nozzle according to an embodiment, employed in the plasma treatment device illustrated in FIG. 1, FIG. 2(a) is a perspective view, and FIG. 2(b) is a cross-sectional view taken along line A1-A1 in FIG. 2(a). FIG. 3 illustrates a gas nozzle according to an embodiment, employed in the plasma treatment device illustrated in FIG. 1, FIG. 3(a) is a perspective view, FIG. 3(b) is a bottom view of FIG. 3(a), and FIG. 3(c) is a cross-sectional view taken along line B1-B1.

The gas nozzle 4 illustrated in FIGS. 2 and 3 includes a supply hole 11 formed in a tubular shape and configured to guide a gas and an injection hole 12 connecting to the supply hole 11, and injects a gas from the injection hole 12. The gas nozzle 4 is made from ceramics or a single crystal including an oxide, a fluoride, or an oxyfluoride of a rare earth element (hereinafter, "an oxide, a fluoride, or an oxyfluoride of a rare earth element" may be referred to as "a rare earth element compound") or an yttrium aluminum composite oxide, as a primary component.

The gas nozzle 4 is formed in a columnar shape, for example. A plurality of the supply holes 11 (four in the example illustrated in FIG. 2) are provided along an axial center of the gas nozzle 4 on a circle, and each of the supply holes 11 is connected to the injection hole 12. The supply hole 11 includes a supply port 13 from which a gas is supplied, and the injection hole 12 includes an injection port 14 from which a gas is injected. The supply hole 11 has a long shape extending not less than 60% of the total length of the gas nozzle 4. The supply hole 11 has a length of not less than 10 mm and not greater than 100 mm and a diameter of not less than 1 mm and not greater than 20 mm, for example.

The injection hole 12 is connected to the supply hole 11 so that an axial center of the injection hole 12 is inclined toward an outer peripheral side of the gas nozzle 4. The injection hole 12 is shorter than the supply hole 11. The diameter of the injection hole 12 is smaller than the diameter of the supply hole 11. The injection hole 12 has a length of not less than 1 mm and not greater than 10 mm and a diameter of not less than 0.1 mm and not greater than 2 mm, for example. A gas fed to the supply port 13 from the gas lead-in pipe 3 is injected into the reaction chamber 2 from the injection port 14 via the supply hole 11 and the injection hole 12 to be diffused in the reaction chamber 2.

The gas nozzle 4 illustrated in FIG. 3 has a columnar shape and includes a portion on an injection port 14 side formed in a hemispherical shape. The radius of the portion having the hemispherical shape is from 20 mm to 50 mm, for example. A recessed portion 15 is formed at an axial center of the gas nozzle 4 on a supply port 13 side, and is used for mounting the gas nozzle 4 to the reaction chamber 2. In addition to the configuration of the gas nozzle 4 illustrated in FIG. 2, the gas nozzle 4 illustrated in FIG. 3 includes, between the supply hole 11 and the injection hole 12, a storage portion 16 having an annular shape that temporarily stores a gas. In a case where the storage portion 16 is provided, the injection hole 12 can be easily positioned with respect to the supply hole 11, and furthermore, the storage portion 16 can prevent backflow of a gas supplied to the supply port 13.

Here, the "primary component" in the present disclosure refers to not less than 90 mass % of a component, based on 100 mass % of components included in the ceramics or the single crystal.

Rare earth element compounds, in particular, yttrium oxide, ytterbium oxide, holmium oxide, dysprosium oxide, erbium oxide, yttrium fluoride, ytterbium fluoride, holmium fluoride, dysprosium fluoride, erbium fluoride, yttrium oxyfluoride, ytterbium oxyfluoride, holmium oxyfluoride, dysprosium oxyfluoride, and erbium oxyfluoride are components having high corrosion resistance to a plasma generation gas G. As the content of the rare earth element compounds in the gas nozzle according to the present disclosure increases, the corrosion resistance increases. In particular, the content of the rare earth element compounds may be not less than 98.0 mass %, not less than 99.5 mass %, and further not less than 99.9 mass %.

The ceramics or single crystal forming the gas nozzle according to the present disclosure may contain, in addition to the primary component, at least one of silicon, iron, aluminum, calcium, and magnesium, for example, as an element. The silicon content may be not greater than 300 mass ppm in terms of $SiO_2$, the iron content may be not greater than 50 mass ppm in terms of $Fe_2O_3$, the aluminum content may be not greater than 100 mass ppm in terms of $Al_2O_3$, and the total content of calcium and magnesium may be not greater than 350 mass ppm in terms of CaO and MgO, respectively. Furthermore, the carbon content may be not greater than 100 mass ppm.

The components included in the ceramics or the single crystal are identified by using an X-ray diffractometer (XRD) employing a CuKα beam, and then, the content of the elements may be determined by using a fluorescent X-ray analyzer (XRF) or an ICP emission spectrophotometer (ICP) and converted into the content of the identified components. The carbon content may be determined using a carbon analyzer.

In the gas nozzle 4 according to the present disclosure, an arithmetic mean roughness Ra of the inner circumferential surface forming the supply hole 11 is smaller on the outflow side than on the inflow side of the gas. Such a configuration suppresses an increase in the gas flow resistance caused by the surface texture of the inner circumferential surface on the outflow side of the gas (in the vicinity of a connecting portion to the injection hole 12). This can reduce the generation of fine particles from the inner circumferential surface.

Here, a difference in the arithmetic mean roughness Ra of the inner circumferential surface on the inflow side and on the outflow side of the gas may be not less than 0.06 μm, and particularly be not less than 0.8 μm. The arithmetic mean roughness Ra of the inner circumferential surface may gradually decrease from the inflow side toward the outflow side of the gas. With such a configuration, the gas flow in the supply hole 11 is closer to a laminar flow than a gas flow in a case where the arithmetic mean roughness Ra of the inner circumferential surface decreases stepwise from the inflow side toward the outflow side of the gas. Therefore, fine particles are further less likely to be generated from the inner circumferential surface.

The gradual decrease in the arithmetic mean roughness Ra from the inflow side to the outflow side of the gas may be exponential or linear. Such a configuration enables a regular gradual decrease of the arithmetic mean roughness Ra, and thus, the gas flow in the supply hole 11 is closer to a laminar flow. Therefore, fine particles are further less likely to be generated from the inner circumferential surface.

Here, the arithmetic mean roughness Ra may be determined using a laser microscope device having a measurement mode conforming to JIS B 0601:2013. Samples to be measured may include, for example, at least three samples, that is, an area in the vicinity of the supply port 13 of the supply hole 11, an area in the vicinity of the connection portion to the injection hole 12, and the central part. When an approximation function (an exponential function, a linear function, or the like) is used and when the skewness of the arithmetic mean roughness Ra described later is calculated, an equal interval may be provided between each of samples with an area in the vicinity of the supply port 13 of the supply hole 11 and an area in the vicinity of the connecting portion to the injection hole 12 considered to be both ends, and at least ten samples may be prepared.

The approximation function (the exponential function, the linear function, or the like) indicating the gradual decrease of the arithmetic mean roughness Ra is set by using a graph tool included in Excel (trademark, Microsoft Corporation), and then, a correlation coefficient R is calculated. Next, the correlation coefficient R is tested at a significance level of 5% (two-sided probability) by using an r table (correlation coefficient test table). If the correlation coefficient R is significant, an approximation function (an exponential function, a linear function, or the like) indicating the gradual decrease of the arithmetic mean roughness Ra is determined.

The arithmetic mean roughness Ra on the inflow side of the gas may be not greater than 2.5 μm. If the arithmetic mean roughness Ra on the inflow side of the gas is within this range, the entire inner circumferential surface is flatter, so that increase in the gas flow resistance caused by the surface texture is suppressed. Therefore, the generation of fine particles from the inner circumferential surface can be reduced.

Here, the arithmetic mean roughness Ra on the inflow side of the gas in the supply hole is smaller than the arithmetic mean roughness Ra on the inflow side of the gas in the injection hole, and a difference therebetween may be not less than 0.2 μm. The skewness of the arithmetic mean roughness Ra of the inner circumferential surface may be not less than 0. In a case where the skewness of the arithmetic mean roughness Ra of the inner circumferential surface is within this range, a mode value (mode) of the arithmetic mean roughness Ra is smaller than the average value of the arithmetic mean roughness Ra. Therefore, an area where fine particles are generated from the inner circumferential surface can be reduced.

The skewness Sk is an index (statistic) indicating a degree by which a distribution is distorted from a normal distribution, that is, the right-left symmetry of the distribution. If skewness Sk>0, a tail of the distribution extends toward the right side. If skewness Sk=0, the distribution is bilaterally symmetrical. If skewness Sk<0, the tail of the distribution extends toward the left side. The skewness Sk of the arithmetic mean roughness Ra of the inner circumferential surface may be obtained by using a SKEW function included in Excel (trademark, Microsoft Corporation).

Next, a manufacturing method of a gas nozzle according to an embodiment of the present disclosure will be described. First, in a case where the gas nozzle is made from ceramics, pure water and a dispersing agent are added to a powder containing a rare earth element compound having a purity of not less than 99.9 mass % or an yttrium aluminum composite oxide as a primary component. Subsequently, the obtained product is ground and mixed in a bead mill to obtain a slurry. The average particle diameter of the powder containing the rare earth element compound or the yttrium aluminum composite oxide as a primary component is not greater than 1.2 μm.

Subsequently, after an organic binder is added to the slurry and the slurry is stirred, the slurry is spray-dried to obtain granules containing the rare earth element compound or the yttrium aluminum composite oxide as a primary component. After a molding die is filled with the granules, the granules are pressed and molded into a columnar shape by using a molding method such as a uniaxial pressing method or a cold isostatic pressing method (CIP pressing method), to obtain a compact.

The compact is subjected to machining to obtain a precursor formed with a pilot hole for a supply hole and a pilot hole for an injection hole. The precursor can be sequentially degreased and fired to obtain a sintered body. Here, the firing atmosphere is preferably an air atmosphere, the firing temperature is not less than 1500° C. and not greater than 1800° C., and the retention time is not less than two hours and not greater than four hours. After the precursor is degreased, the precursor may be pressurized and sintered under a nitrogen gas atmosphere, an argon gas atmosphere, or a helium gas atmosphere used as the firing atmosphere at the firing temperature of not less than 1500° C. and not greater than 1800° C. during the retention time of not less than two hours and not greater than four hours at the pressure of not less than 20 MPa and not greater than 25 MPa.

The gas nozzle according to the present disclosure can be obtained by polishing at least the inner circumferential surface forming the supply hole in the sintered body by using an abrasive flow polishing method. Specifically, a viscoelastic medium containing a rheopectic fluid and abrasive particles may be fed under pressure from the supply port side toward the inside of the supply hole. The rheopectic fluid refers to a fluid a viscosity of which increases over time under application of pressure. An examples of the abrasive particles may include spherical particles made from aluminum oxide, cerium oxide, zirconium oxide, stainless steel, glass, and the like and having a hardness of not greater than 12 on the modified Mohs hardness scale.

To obtain a gas nozzle including the inner circumferential surface having the arithmetic mean roughness Ra gradually decreasing from the inflow side toward the outflow side of the gas, the above-described spherical particles having an average particle diameter of not less than 90 μm and not greater than 350 μm may be used, for example, to polish the inner circumferential surface at a particle concentration of not less than 2 vol % and not greater than 16 vol % with respect to 100 vol % of a viscoelastic abrasive medium.

To obtain a gas nozzle having the arithmetic mean roughness Ra gradually decreasing from the inflow side toward the outflow side of the gas in an exponential or linear manner, the above-described spherical particles having an average particle diameter of not less than 150 μm and not greater than 350 μm may be used, for example, to polish the inner peripheral surface at a particle concentration of not less than 2 vol % and not greater than 16 vol % with respect to 100 vol % of a viscoelastic abrasive medium.

To obtain a gas nozzle having not greater than 2.5 μm of the arithmetic mean roughness Ra on the inflow side of the gas, spherical aluminum oxide particles having an average particle diameter of 302.5 μm (particle size #60) may be used, for example, to polish the inner peripheral surface for not less than five minutes at a particle concentration of 8 vol % with respect to 100 vol % of the viscoelastic abrasive medium.

To obtain a gas nozzle having not less than 0 of the skewness Sk of the arithmetic mean roughness Ra on the inner circumferential surface, spherical aluminum oxide particles having an average particle diameter of 302.5 μm (particle size #60) may be used, for example, to polish the inner circumferential surface for not less than seven minutes at a particle concentration of 8 vol % with respect to 100 vol % of the viscoelastic abrasive medium.

The arithmetic mean roughness Ra of the inner circumferential surface forming the supply hole obtained by the manufacturing method described above is, for example, 1.84 μm on the inflow side of the gas (in the vicinity of the supply port of the supply hole), 0.61 μm at the central part, and 0.56 μm on the outflow side of the gas (in the vicinity of the connecting portion to the injection hole).

As described above, a case where the inner circumferential surface forming the supply hole is polished by an abrasive flow polishing method has been described. However, instead of the abrasive flow polishing method, two-stage machining may be employed. In this case, specifically, a pilot hole for the supply hole and a pilot hole for the injection hole are formed in the compact mentioned above by using a first cutting tool including a first shank provided with a spiral-shaped flute. Subsequently, a precursor in which at least the inner circumferential surface forming the pilot hole for the supply hole is machined may be obtained by using a second cutting tool including a second shank mounted with a disc-shaped tip at an end of the second shank, the disc-shaped tip having a diameter greater than the diameter of the second shank.

The first shank may have a different diameter in accordance with each of the diameters of the pilot hole for the supply hole and the pilot hole for the injection hole. The first shank may be inserted from the supply port side when the pilot hole for the supply hole is formed, and from the injection port side when the pilot hole for the injection hole is formed. The second shank may also be inserted from the supply port side.

The spiral-shaped flute provided in the first shank is used for discharging cutting chips. In a case where the second cutting tool mounted with the disc-shaped tip having a diameter greater than that of the second shank is used, a space for discharging cutting chips more efficiently is formed on a side opposite to the machined surface of the tip, and this provides the inner circumferential surface with a good surface texture.

The precursor obtained by the two-stage machining is degreased and fired by the method described above, and a gas nozzle being a sintered body can be obtained. If necessary, both end surfaces of the obtained gas nozzle may be subjected to grinding.

The arithmetic mean roughness Ra of the inner circumferential surface forming the supply hole obtained by the manufacturing method described above is, for example, 1.92 μm on the inflow side of the gas (in the vicinity of the supply port of the supply hole), 1.39 μm at the central part, and 1.02 μm on the outflow side of the gas (in the vicinity of the connecting portion to the injection hole). Instead of forming the pilot hole for the injection hole in the compact by machining, the injection hole may be formed in the sintered body by honing processing, rotary ultrasonic processing, or grinding processing.

In a case where the gas nozzle according to the present disclosure is made from single crystal, a columnar single crystal ingot including a rare earth element compound and an yttrium aluminum composite oxide as a primary component is first grown. The single crystal ingot may be formed by a single crystal growing method such as a Czochralski method (CZ-method, pulling method) or a floating zone (FZ) method. This single crystal ingot is subjected to honing processing, rotary ultrasonic processing, or grinding processing to form a supply hole and an injection hole, and then, the gas nozzle according to the present disclosure can be obtained by polishing at least the inner circumferential surface forming the supply hole by using the abrasive flow polishing method mentioned above.

In the gas nozzle obtained by any one of the manufacturing methods described above, increase in the gas flow resistance caused by the surface texture of the inner circumferential surface on the outflow side of the gas (in the vicinity of the connecting portion to the injection hole) is suppressed. As a result, the generation of fine particles from the inner circumferential surface can be reduced.

The present disclosure is not limited to the above-described embodiment, and various modifications, improvements, combinations, and the like may be made without departing from the gist of the present disclosure.

REFERENCE SIGNS LIST

1 Plasma treatment device
2 Reaction chamber
3 Gas lead-in pipe
4 Gas nozzle
5 Substrate
6 Internal electrode
7 Substrate holding portion
8 Bias power supply
9 Coil
10 Power supply
11 Supply hole
12 Injection hole
13 Supply port
14 Injection port
15 Recessed portion
16 Storage portion

The invention claimed is:

1. A gas nozzle, comprising:
a supply hole having a tubular shape and configured to guide a gas; and
an injection hole connecting to the supply hole,
wherein a central axis of the injection hole extends in a different direction from a central axis of the supply hole,
wherein the gas nozzle configured to inject the gas from the injection hole is made from ceramics or single crystal including an oxide, a fluoride, or an oxyfluoride of a rare earth element or an yttrium aluminum composite oxide as a primary component, and
an arithmetic mean roughness Ra of an inner circumferential surface of the supply hole on an outflow side of the supply hole is smaller than an arithmetic mean roughness Ra of an inner circumferential surface of the supply hole on an inflow side.

2. The gas nozzle according to claim 1, wherein the arithmetic mean roughness Ra of the inner circumferential surface gradually decreases from the inflow side toward the outflow side of the gas.

3. The gas nozzle according to claim 2, wherein the gradual decrease of the arithmetic mean roughness Ra from the inflow side toward the outflow side of the gas is exponential or linear.

4. The gas nozzle according to claim 1, wherein the arithmetic mean roughness Ra on the inflow side of the gas is not greater than 2.5 μm.

5. The gas nozzle according to claim 1, wherein a skewness Sk of the arithmetic mean roughness Ra of the inner circumferential surface is not less than 0.

6. The gas nozzle according to claim 1, wherein an annular storage portion configured to temporarily store the gas is provided between the supply hole and the injection hole.

7. A plasma treatment device comprising:
the gas nozzle according to claim 1.

8. The gas nozzle according to claim 1, wherein a diameter of the injection hole is smaller than a diameter of the supply hole.

* * * * *